United States Patent [19]

Hall

[11] Patent Number: 5,057,775
[45] Date of Patent: Oct. 15, 1991

[54] METHOD OF TESTING CONTROL MATRICES FOR FLAT-PANEL DISPLAYS

[75] Inventor: Henry P. Hall, Concord, Mass.
[73] Assignee: GenRad, Inc., Concord, Mass.
[21] Appl. No.: 518,453
[22] Filed: May 4, 1990
[51] Int. Cl.$^5$ .............................................. G01R 31/02
[52] U.S. Cl. ................................ 324/158 R; 324/73.1
[58] Field of Search ............... 324/158 T, 158 R, 678, 324/679, 73.1, 158 D; 340/719, 784; 437/8

[56] References Cited

U.S. PATENT DOCUMENTS

| | | | |
|---|---|---|---|
| 4,731,610 | 3/1988 | Baron et al. | 340/719 |
| 4,819,038 | 4/1989 | Alt | 357/4 |
| 4,820,222 | 4/1989 | Holmberg et al. | 340/784 |
| 4,833,393 | 5/1989 | Wetzel | 324/679 |
| 4,843,312 | 6/1989 | Hartman et al. | 324/158 R |

OTHER PUBLICATIONS

Wisnieff et al., "In-Process Testing of Thin-Film Transistor Arrays", 190 SID 90 Digest, No. 11.2, 6/90.
Nagae et al., "Smectic Liquid-Crystal . . . "; IEEE Trans. on Electron Devices; vol. ED-32; No. 4; Apr. 1985; pp. 744-748.

*Primary Examiner*—Ernest F. Karlsen
*Attorney, Agent, or Firm*—Cesari and McKenna

[57] ABSTRACT

An AC signal source (26) in series with a variable DC source (34) drives a gate line of an LCD-display drive matrix (10), and current meters (28, 30, 32) monitor the resultant currents in the drain lines. By comparing the thus-measured transadmittance both with and without enabling values of the DC-source output, one can test the matrix (10) for defects.

15 Claims, 3 Drawing Sheets

METHOD OF TESTING CONTROL MATRICES FOR FLAT-PANEL DISPLAYS

BACKGROUND OF THE INVENTION

The present invention is directed to testing flat-panel displays and in particular to testing the matrices of thin-film transistors that are employed in active-matrix liquid-crystal display panels.

An active-matrix liquid-crystal display is a flat-panel device that provides a screen divided into pixels, each of which, in a color version, contains three liquid-crystal devices disposed between a backlighting device and respective red, green, and blue filters. By varying the potential across the liquid-crystal devices (LCDs), one can change their light transmittances and thus form an image on the screen by selectively driving the LCDs.

The pixels are organized in rows and columns in the conventional manner. In an active-type LCD display, a separate transistor drives each color in each pixel. All the LCDs have one of their electrodes connected to a common potential, and each has its other electrode connected to the source or drain of its corresponding transistor. The other channel terminal (source or drain) of the transistor is connected to a data line, which is similarly connected to all of the transistors for the same color in the same column. The transistor gate is connected to a select line, which is similarly connected to all transistors in the same row.

To drive the display, one places an enabling voltage on the select line of the row to be scanned and applies drive voltages indicative of the desired brightnesses to the various column lines individually. Although those drive voltages are applied to the transistors in all of the rows, the light transmittances of the LCDs in only the selected row are affected, because only those transistors have been turned on so as to couple the drive voltages to the transistors.

Flat-panel displays are among the most difficult of electronic devices to fabricate. The drive matrix typically includes over 100,000 transistors, and the LCD panel has an equal number of LCDs. All of those devices must operate properly, or at least almost all of them must, and they must be appropriately aligned with their corresponding LCDs. For these reasons, many of the steps in the process typically result in very low yields, and it is important to test component parts at the early stages of the process so as to avoid incorporating defective parts into later processes and thus wasting time, material, and money. In particular, it is important to test the drive matrix before it is connected to the LCD layer.

However, testing the matrix before it is assembled into the completed part presents significant problems because the matrix lends itself neither to functional testing nor to in-circuit testing. In-circuit testing, i.e., probing internal nodes so as to test the functions of the individual internal devices—in this case the individual transistor drives—is difficult; the small sizes of the transistors makes probing their individual terminals with conventional probes virtually impossible, while the use of more-exotic devices such as scanning electron microscopes to determine internal node voltages can be prohibitively expensive.

Because of the relatively low number of readily accessible terminals, it might initially seem preferable to employ functional testing, in which only the overall result of the complete circuit's operation is verified by stimulating the device from readily accessible contact points and observing the external behavior. Unfortunately, the matrix's overall function is to vary the transparencies of LCD elements to which the matrix has not yet been connected, so there is little external behavior to observe.

Testing drive matrices thus does not lend itself to traditional test approaches.

SUMMARY OF THE INVENTION

I have invented a test method for such matrices that does not require a demonstration of overall functional result but that permits the needed probing to be restricted to little more than the readily accessible select and drive terminals. At those terminals I take measurements from which one can infer what I will refer to as an "AC port parameter," or a component or absolute value thereof, at a port or ports comprising the terminals of different select and/or drive lines. By AC port parameter, I mean either driving-point (two-terminal) admittance or impedance at a given frequency or a two-port parameter, i.e., any ratio between input current or voltage and output current or voltage at a given frequency. Preferably, however, it is a transimmittance, i.e., transimpedance or transadmittance—between two ports, each of which includes a node on a different drive or select line. I can derive from these measurements most of the information that one would ordinarily need to resort to an in-circuit test to obtain.

For example, I may drive one or more of the row or column lines of the drive matrix with an AC voltage and measure the current that results in one or more of the other lines so as to determine whether the thus-measured transadmittances behave as they do when the matrix operates properly. That determination can be made by simply comparing each actual transadmittance value with the corresponding transadmittance of a good matrix. In the alternative, a variable DC bias voltage can be applied to one or more select lines, possibly by being superimposed on the AC stimulus, to turn selected transistors on and off, and their proper operation can be determined by observing whether the resulting transadmittance changes appropriately. By making these measurements at various pairs of ports, it is possible to detect most common types of defects.

BRIEF DESCRIPTION OF THE DRAWINGS

These and further features and advantages of the present invention will be described below in connection with the accompanying drawings, in which.

DETAILED DESCRIPTION OF AN ILLUSTRATIVE EMBODIMENT

Figure 1:
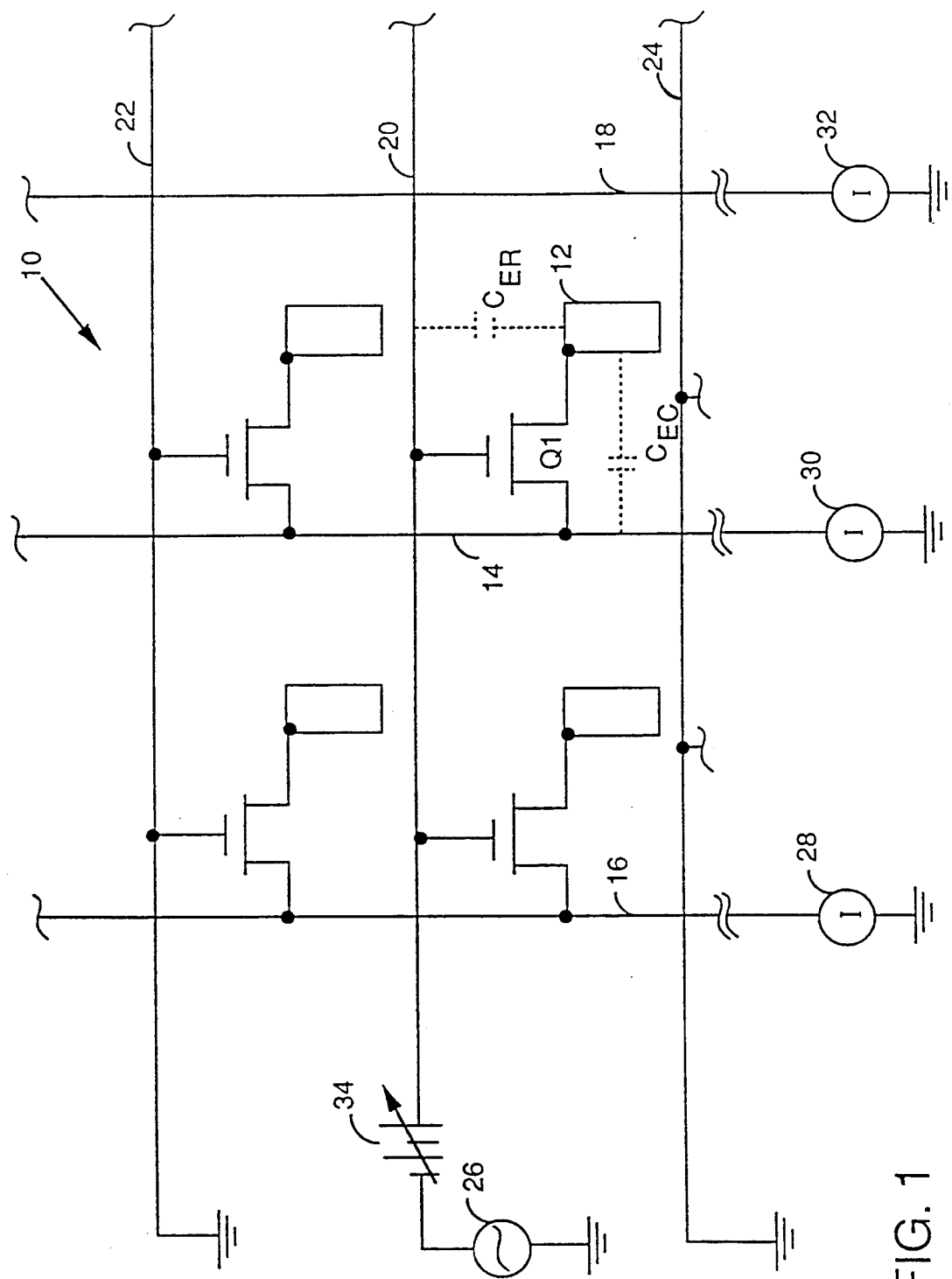
FIG. 1 is a schematic diagram of a drive matrix together with a test set-up of the type employed in accordance with the present invention.

FIG. 1 depicts in schematic form a portion of the drive matrix for a flat-panel LCD display as well as test circuitry for testing it by measuring transimmittances.

The display is organized into rows and columns of pixels, and the drive matrix for a color display includes three electrodes like electrode 12 for each pixel. Upon assembly into a complete display, electrode 12 will be disposed on one side of the liquid-crystal material, and an electrode disposed on the other side will be tied to a fixed, common voltage.

To control the transparency of the LCD, an insulated-gate field-effect transistor Q1 is provided with its source connected to electrode 12 and its drain connected to a common line 14, to which the drains of the transistors that control all of the same-color pixels in the same column are also connected. Line 14 will be referred to as a "column line," a "drain line," or a "data line." Similar column lines 16 and 18 are connected to the drains of the transistors for different pixel columns or different colors in the same pixel column. The gate electrode of transistor Q1 is connected to a row line (or "select line" or "gate line") 20, which conducts enabling signals to the gates of the transistors that control all of the pixels in the same row. Row lines 22 and 24 similarly conduct enabling signals to transistors in different rows.

To affect the transparency of the liquid crystal at the location of electrode 12, a drive signal is placed on column line 14. If an enabling voltage is present on row line 20, transistor Q1 forwards this drive signal to electrode 12, causing the desired potential difference across the LCD and thus causing it to assume the desired degree of transparency. The same drive voltage is applied to the transistors that control all of the other pixels of the same color in the same column, but none of the others would typically have an enabling voltage on its row line at the same time, so when the drive signal controls electrode 12, it affects that electrode only.

The purpose of the matrix is to control the transparency of the various pixels. The straightforward way to test this function, of course, is to connect the matrix to a liquid-crystal panel and observe the result when predetermined select and drive signals are applied. However, it is usually too expensive to connect the drive matrix to the liquid-crystal panel before one has verified that both are good. One might therefore consider applying the predetermined drive and sense signals and sensing the resulting voltages on the electrodes. Because of the small size and large number of the electrodes, however, it will not usually be feasible to probe the electrodes in production volumes. Moreover, since the only intended ohmic connection to the pixels occurs through the transistors, there is no alternate location that one can probe to sense the electrode's voltage.

According to the present invention, proper operation is verified, and defects diagnosed, by making measurements indicative of an AC port parameter—preferably of an AC transimmittance. In principle, the transimmittance measurement in the illustrated embodiment is made by employing at least one AC voltage source 26, one or more current detectors 28, 30, and 32, and preferably a variable DC source 34 to bias matrix transistors on and off. Source 34 may conveniently be connected in series with the AC source, although it can be separately applied to a different select line. The AC source 26 applies an alternating voltage to one of the row or column lines, and a current detector measures the resultant current that flows in another one of the row and column lines. If the AC and DC sources are connected in series, that composite source is connected to one of the gate lines 20, 22, and 24, while the current meters are connected to any of the other lines but preferably to at least one of the drain lines 14, 16, and 18. Because capacitances exist between the electrodes and the lines, between transistor terminals, and between the lines themselves, transadmittance results between a port that includes the driven line's terminal and each port whose current a current meter senses. By measuring the various currents, and thereby various transimmittances, it is possible to detect various types of faults.

For example, if the driven gate line 20 is open at some point, the transadmittance between the driven line and column lines downstream of the break will be lower than it otherwise would be, while the transadmittance between the driven line and the column lines upstream of the break will be relatively unaffected. The departure from normal can be determined simply by comparing the measured transadmittance with the corresponding transadmittance of a properly operating device. In the alternative, the departure can be determined by observing the differences in the transadmittances that result from operating the variable DC source 34 so as to switch the transistors in the corresponding row between their on and off states. The effective capacitance between the row line and the column lines upstream of the break, where the transistors are turned on and off, should change because those transistors short out a series capacitance $C_{EC}$ in the reactive path comprising that capacitance and the capacitance $C_{ER}$ between the row line and the electrode. On the other hand, the corresponding capacitances downstream of the break, where the transistors do not turn on and off, should change very little. The transadmittance should therefore change significantly upstream of the break but not downstream.

An open drain line can be detected in an analogous manner. If the drain-line measurements that result from the driving of any row line up to a certain point are proper—e.g., if they change with row-line bias—but those resulting from the driving of row lines beyond that point are not, a drain-line short is the likely cause.

Another possible defect is an open circuit in the source or drain of a transistor. Either of these defects would reduce the change in transadmittance that results from changing the DC bias voltage.

Another type of defect is a short circuit from the gate line of a transistor to its source or associated LCD electrode. Such a defect would cause a high transconductance when the transistor turns on but not when it turns off. A short circuit of this type, as well as a short circuit from the gate to the drain line, does not require measurement of the transadmittance in response to particular AC stimuli; simple DC measurements would be adequate, and the teachings of the present invention, while effective, are not required.

The teachings of the present invention are required to detect a short from the drain to the source or electrode, however. Such a defect would increase the capacitance that results when the transistors are turned off, and it would result in no difference between on and off capacitances.

Other possible defects involve short circuits between neighboring cells rather than between parts of the same cell. For instance, electrode 12 could be shorted to the next gate line, i.e., to a gate line such as line 24, that does not control the transistor associated with that electrode. In the test set-up shown in FIG. 1, the gate lines not driven are grounded, so an electrode-to-adjacent-gate short causes the capacitance between the electrode's row and column lines to decrease, not increase, when the transistor is turned on. If the test set-up additionally includes current meters in adjacent row lines, the resultant increased transadmittance to the adjacent row line involved can also be detected. Such a test set-up is also beneficial in detecting an electrode-to-electrode short circuit across a gate line.

Another approach to detecting this type of fault is to drive one gate line with the AC signal but separately drive the adjacent gate line with the DC bias. A short circuit from the electrode to the AC-driven gate line then manifests itself as a large current in the drain line that disappears when the DC bias is removed.

A short circuit between an electrode and an adjacent drain line, e.g., between electrode 12 and line 18, might appear as a difference in transadmittance as measured by current meter 32. For this type of fault, however, it may prove desirable in some applications to provide an AC source on line 14. This would result in an easily detected current change in meter 32 when the DC level on line 20 changes between its enabling and disabling values.

FIG. 1 depicts a single source 20 and a plurality of current meters 28, 30, and 32. The number of simultaneously employed meters in a given application will depend on speed and cost considerations. In principle, there is no reason why all of the lines cannot be monitored simultaneously, and it seems likely that such an arrangement will prove to be beneficial for high-volume production. On the other hand, it is also possible in principle to monitor only one line at a time. In practice, however, this is unlikely to be feasible for production purposes, since tests would have to be run with all combinations of each gate line with most, if not all, of the drain lines and probably with some of the other gate lines. Monitoring only one line at a time therefore is probably adequate only for experimental purposes.

Additionally, the method is not limited to the use of only a single AC source at a time. For instance, different gate lines could be driven with signals of different frequencies, and the meters could simultaneously make separate measurements of the responses at the different frequencies. A given meter could thus measure more than one transadmittance at a time.

Clearly, the approach of the present invention offers considerable diagnostic information, and the symptoms for many faults can be determined, at least theoretically, by calculation. For many faults, however, the correlation between faults and symptoms will be recognized more readily by experience, possibly through the use of "signature"-type techniques commonly employed in many automatic-test applications.

The foregoing discussion describes the principles of operation. We now turn to a discussion of certain practical considerations that should be taken into account in the typical specific application.

Figure 2:
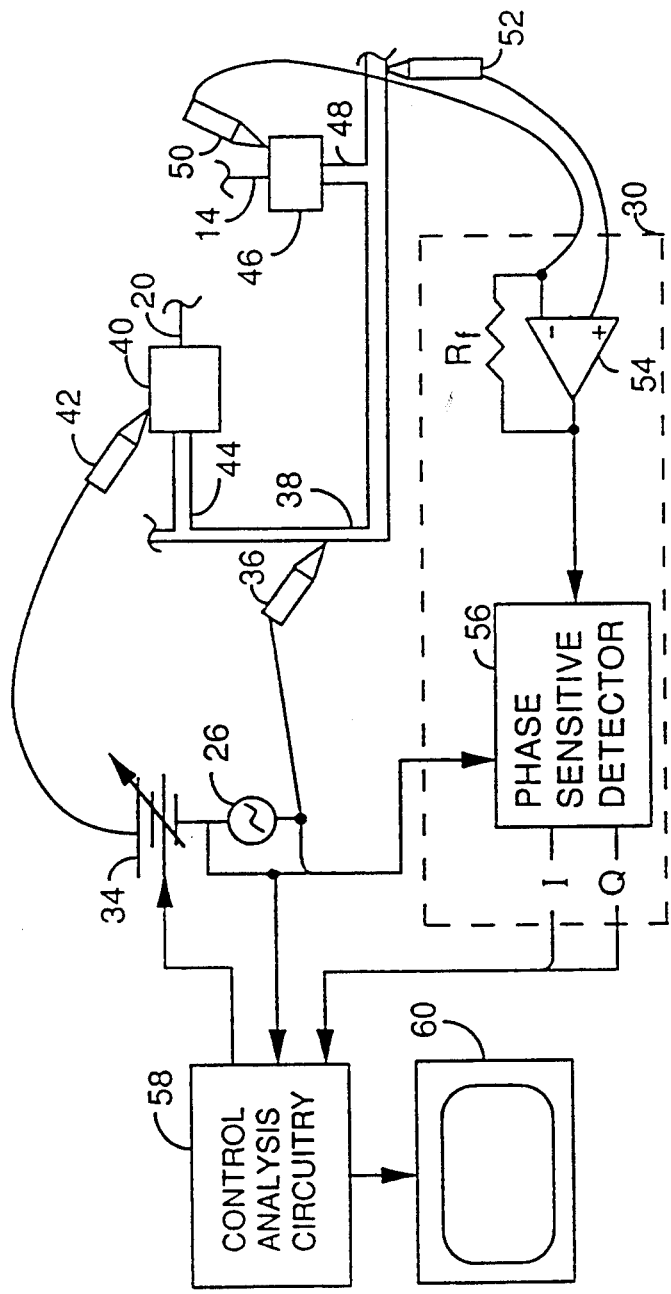
FIG. 2 is a more-detailed diagram of parts of the test equipment and its connection to the matrix.

FIG. 2 depicts the AC source 26 and DC source 34 of FIG. 1. Whereas FIG. 1 merely shows the AC source 26 as being connected to a ground symbol, FIG. 2 shows its connection by means of a probe 36 to a (typically grounded) guard ring 38. Although row and column lines such as lines 14 and 20 are to be driven individually in the assembled product, groups of them are typically connected together during the fabrication process by guard conductors, which are used to protect the transistors from damaging potentials, such as those that result from electrostatic discharge during handling.

FIG. 2 depicts only a single guard ring 38, but some testing operations can be made simpler by connecting different subsets of the lines together with different guard conductors.

Access to row line 20 is afforded by means of a connection pad 40, to which contact is made by a probe 42 connected to one end of the series combination of the AC and DC sources 26 and 34. Because of the guard ring, the sources have to drive the (typically relatively small) resistance provided by the path 44 between the pad 40 and the guard ring 38. Path 44 presents a significant load, so it is desirable for that path to be fabricated with as high a resistance as is feasible. Of course, too high a resistance would defeat the purpose of the guard ring, but a very low resistance loads the voltage source unnecessarily.

A similar contact pad 46 provides the connection to the column line 14, and a path 48 similar to path 44 provides an electrical connection between the guard ring 38 and that contact pad 46.

The presence of the guard ring 38 is one of the reasons why it is preferable to make measurements indicative of a transimmittance or other two-port parameter even though the broader aspects of the invention can be performed in principle by measurements indicative of a driving-point (two-terminal) immittance, e.g., by measurements made by imposing the source voltages between terminals 40 and 46 and measuring the source current with no guard connection. In such a measurement of a driving-point immittance, the guard ring 38 would represent a very high parallel conductance that in most cases would totally mask the parameter of interest. Of course, in situations in which the two terminals are connected to different guard conductors, the use of driving-point immittances is more practical.

Probes 50 and 52 provide the connection to the current sensor 30, which FIG. 2 depicts in more detail. The current sensor 30 can include an operational amplifier 54, which is connected to a feedback resistor $R_f$ so as to maintain a virtual ground at the column-line contact pad 46; that is, negative feedback causes amplifier 54 to drive its inverting input terminal to a value that nearly equals the voltage on the guard ring 38, and the effect is that the current sensor 30 presents a very-low-impedance path in parallel with connection 48. It is desirable for most of the current from line 14 to pass through the feedback resistor $R_f$ rather than through path 48, and this is another reason why it is desirable for those connections to have significant resistance.

The output of amplifier 54 is a voltage that is proportional to the current that flows through feedback resistor $R_f$ and that thus is also proportional to the current that flows in row line 14. A phase-sensitive detector 56 measures the in-phase and quadrature components of the voltage across $R_f$, and thus of the current in line 14, by reference to the phase of source 26. Control and analysis circuitry 58, typically in the form of a digital computer, receives these measurements, compares them with known good values or other measurements made during the test, as mentioned above, and presents diagnostic or go/no-go results on an appropriate display 60.

The discussion so far has focused primarily on short-circuit transadmittance measurements because that quantity is relatively convenient to use; the guard resistance is low, and, in situations in which the stimulus voltage can be controlled precisely enough, detection and diagnosis can be based simply on the current measurements without the need for an explicit admittance calculation. However, those skilled in the art will recognize that the particular type of port parameter used is not critical, although a two-port parameter will often be preferred over a driving-point (two-terminal) immittance, as was explained above.

It may be found sufficient in some instances simply to measure the absolute value of the immittance or other parameter rather than its complex value. Alternatively, measurement of only one component, such as transsusceptance, transconductance, transreactance, or transresistance, possibly by measuring only the in-phase or quadrature component of a measured current or voltage, may be found acceptable and even preferable in many applications. Accordingly, references to port parameters should be understood to include absolute values or individual components as well as complete complex values.

A point of particular interest in FIG. 2 is that the schematic ground to which source 26 and meter 30 are shown connected in FIG. 1 are respectively the points at which separate probes 36 and 52 contact the guard ring 38; that is, the ground connections of the two devices to the guard ring 38 are separate; they are not made to a common point that in turn is connected to the guard ring 38. The reason for this can be appreciated by reference to FIG. 3, which is a schematic diagram that roughly approximates aspects of the test set-up that would result if the source 26 and meter 30 were connected to the ring by a common path.

Figure 3:
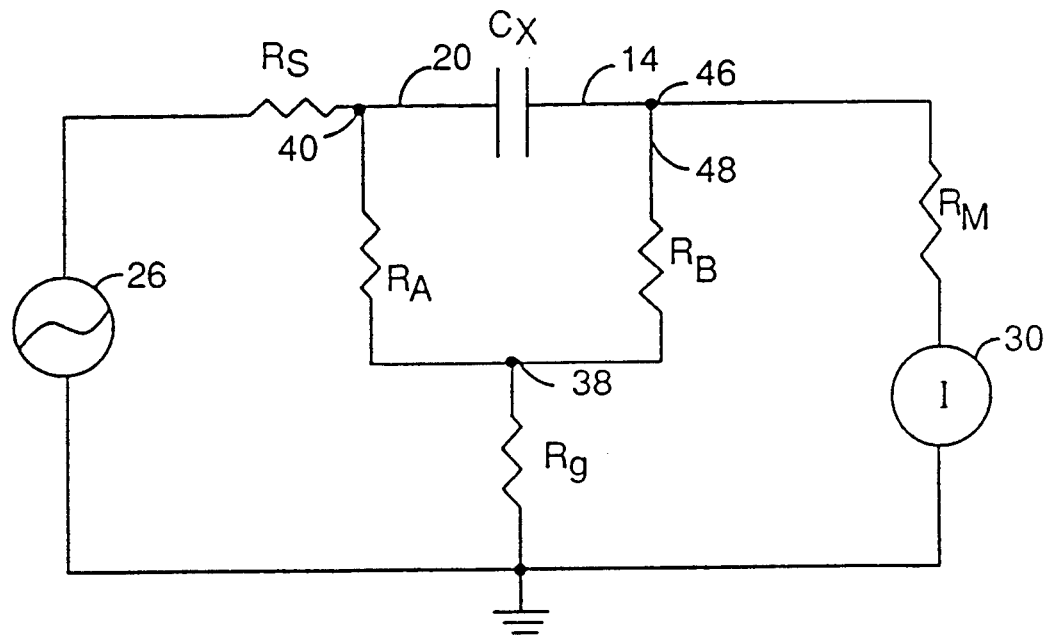
FIG. 3 is a simplified schematic diagram of the circuit that results when the teachings of the present invention are employed in a arrangement.

In FIG. 3, the source 26, which has source impedance $R_s$, is connected to node 40, which represents the correspondingly numbered contact pad of FIG. 2. A first resistance $R_A$ represents the resistance of the connection 44 between the pad 40 and the guard ring 38, which FIG. 3 represents with a correspondingly numbered node 38. The current meter 30, together with its input impedance $R_m$, is shown connected to a node 46, which represents the correspondingly numbered pad 46. Node 46 is in turn connected to the guard ring 38 by a connection 48 having a resistance $R_B$. The unknown of interest, i.e., the capacitance between the two pads, is represented in FIG. 3 by capacitance $C_x$. It is the value of this capacitance $C_x$ that provides the diagnostic information of interest.

If the source and the meter were connected to a common ground location that in turn is connected to the guard ring 38, they would be connected to it through a common lead-and-contact resistance $R_g$.

The lead-and-contact resistance $R_g$ might be kept down to a few ohms, while the values of $R_A$ and $R_B$ might be one or two orders of magnitude higher. On the other hand, the value of $C_x$ can be expected to be less than a picofarod. The frequency of the source signal will be dictated to some extent by the particular matrix under test. Up to a point, higher frequencies are better, because they result in higher measurable currents for a given (typically low) capacitance, and they permit the measurements to be taken faster. But use of too high a frequency results in shunting of the row- and column-line resistances by other stray capacitances and thus complicating the dependence of the measured transadmittance on the particular capacitances of interest. In light of this limitation, we will assume that the impedance of $C_x$ is very large in comparison with the other FIG. 3 impedances. If the source impedance $R_s$ can be ignored, the voltage at node 38—i.e., at the guard ring—under these assumptions is approximately $E_s R_g / R_A$, where $E_s$ is the source voltage.

The current seen by the current meter 30 as a result of the conductance path comprising $R_s$, $R_A$, $R_B$, and $R_m$ is thus approximately $E_s R_g / R_A R_B$ if $R_m$ can be ignored; i.e., the transconductance is approximately $R_g / R_A R_B$. Even if this value turns out to be only on the order of $10^{-5}$ mhos, it completely swamps the parallel susceptance $j2\pi C_x$ of interest unless the source frequency is on the order of 1 MHz or higher, and frequencies that high, as was explained above, would probably not be desirable. The FIG. 3 arrangement is thus disadvantageous because the resultant measurement would be relatively insensitive to the parameter of interest.

Figure 4:
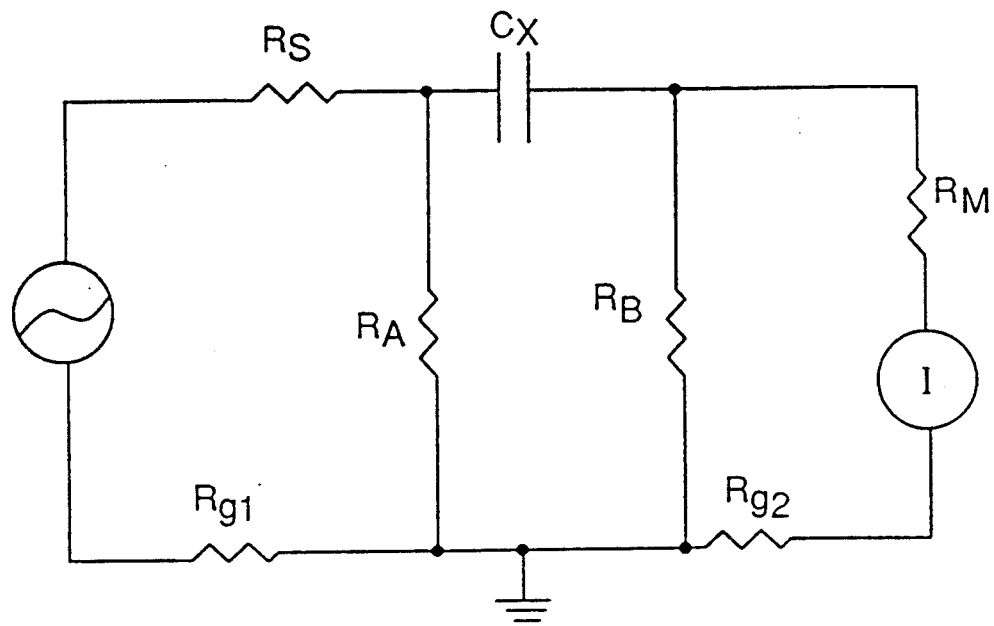
FIG. 4 is a similar diagram showing the arrangement that results when the teachings of the present invention are employed in a double-guard arrangement.

We now consider the circuit that results from the double-guard approach depicted in FIG. 2. FIG. 4 represents this circuit schematically.

The labels used for the elements in FIG. 4 are identical to those used for corresponding elements in FIG. 3, with the exception that the unitary lead-and-contact resistance $R_g$ of FIG. 3 is replaced in FIG. 4 with two such resistances, $R_{g1}$ and $R_{g2}$, which represent the lead-and-contact resistances of the separate connections to the guard ring 38. Study of FIG. 4 reveals that, unlike the circuit of FIG. 3, that of FIG. 4 provides no parallel current path around the capacitance $C_x$. Consequently, the transimpedance is largely the reactance of $C_x$ alone, namely, $\frac{1}{2}\pi f C_x$, if $R_A$ is large with respect to $R_{g2}$ and $R_m$. Even if it is not so large, the transimpedance is still proportional to that reactance and thus is very sensitive to it. The double-guard approach is therefore preferable in most situations.

By employing the methods of the present invention, it is possible to test the drive matrices of flat-panel displays by simply probing readily accessible test points, i.e., to test them without employing more-complicated procedures such as those required with scanning electron microscopes. Accordingly, the present invention represents a significant advance in the art.

I claim:

1. A method of testing a flat-panel display drive matrix comprising the steps of:
   A) providing a flat panel-display drive matrix of the type that includes a plurality of transistors arranged in rows and columns, a column line associated with each column, and a row line associated with each row, each transistor including source and drain terminals, one of which is an open terminal adapted to serve as an LCD electrode and the other of which is connected to the column line associated with its transistor's column, each transistor further including a gate terminal connected to the row line associated with its transistor's row; and
   B) before connecting the drive matrix to liquid-crystal material to produce a flat-panel display,
   i) measuring a quantity indicative of AC-signal transmittances between a first port, of which one terminal is a node on one of the lines, and a second port, of which one terminal is a node on another of the lines, while first and second DC levels are applied between row and column lines;
   ii) determining whether the relationship between the transimmittances that result from the first and second DC levels meets predetermined criteria representative of various possible defects in the matrix; and
   iii) generating an indication of the result of that determination.

2. A method as defined in claim 1 wherein the measuring step comprises applying an AC voltage at the first port and measuring the resultant current at the second port.

3. A method as defined in claim 2 wherein:
A) the matrix further includes a plurality of contact pads;
B) each line is associated with a respective contact pad, which provides electrical communication therewith; and
C) the one terminal of the first port is the contact pad with which the one of the lines is associated and the one terminal of the second port is the contact pad with which the other of the lines is associated.

4. A method as defined in claim 3 wherein:
A) the drive matrix includes a guard conductor that interconnects a plurality of the lines; and
B) the other terminal of each port is a node on the guard conductor.

5. A method as defined in claim 4 wherein:
A) the step of applying the voltage comprises applying the voltage by means of probes that contact the guard conductor and the contact pad that serves as the one terminal of the first port; and
B) the step of measuring the current comprises measuring the current by means of probes that contact the guard conductor and the contact pad that serves as the one terminal of the second port.

6. A method as defined in claim 5 wherein the voltage-applying and current-measuring steps have no probes in common.

7. A method as defined in claim 1 wherein:
A) the drive matrix includes a guard conductor that interconnects a plurality of the lines: and
B) the other terminal of each port is a node on the guard conductor.

8. A method as defined in claim 1 wherein the measuring step comprises measuring a plurality of transimmittances simultaneously.

9. A method as defined in claim 8 wherein the measuring step comprises applying an AC voltage at the first port and measuring the resultant current at each second port.

10. A method as defined in claim 9 wherein:
A) the matrix further includes a plurality of contact pads;
B) each line is associated with a respective contact pad, which provides electrical communication therewith; and
C) the one terminal of the first port is the contact pad with which the one of the lines is associated and the one terminal of each second port is the contact pad with which the other of the lines is associated.

11. A method as defined in claim 10 wherein:
A) the drive matrix includes a guard conductor that interconnects a plurality of the lines; and
B) the other terminal of each port is a node on the guard conductor.

12. A method as defined in claim 11 wherein:
A) the step of applying the voltage comprises applying the voltage by means of probes that contact the guard conductor and the contact pad that serves as the one terminal of the first port; and
B) the step of measuring the current comprises measuring the current by means of probes that contact the guard conductor and the contact pad that serves as the one terminal of each second port.

13. A method as defined in claim 12 wherein the voltage-applying step has no probe in common with the current-measuring steps.

14. A method as defined in claim 8 wherein:
A) the drive matrix includes a guard conductor that interconnects a plurality of the lines; and
B) the other terminal of each port is a node on the guard conductor.

15. A method a defined in claim 1 wherein the measuring step includes the steps of applying an AC voltage at a port of which one terminal is a node on one of the lines and of measuring a current that flows as a result.

* * * * *